United States Patent
Lee et al.

(10) Patent No.: US 9,982,340 B2
(45) Date of Patent: May 29, 2018

(54) SHOWER HEAD APPARATUS AND METHOD FOR CONTROLLING PLASMA OR GAS DISTRIBUTION

(75) Inventors: Chih-Tsung Lee, Hsinchu (TW); Hung Jui Chang, Shetou Shiang (TW); You-Hua Chou, Taipei (TW); Shiu-Ko Jangjian, Tainan (TW); Chung-En Kao, Toufen Township (TW); Ming-Chin Tsai, Hsinchu (TW); Huan-Wen Lai, Tainan (TW)

(73) Assignee: Taiwan Semiconductor Manufacturing Co. Ltd., Hsin-Chu (TW)

( * ) Notice: Subject to any disclaimer, the term of this patent is extended or adjusted under 35 U.S.C. 154(b) by 1332 days.

(21) Appl. No.: 13/439,127

(22) Filed: Apr. 4, 2012

(65) Prior Publication Data

US 2013/0267045 A1    Oct. 10, 2013

(51) Int. Cl.
| | |
|---|---|
| *C23C 16/44* | (2006.01) |
| *C23C 16/30* | (2006.01) |
| *C23C 16/509* | (2006.01) |
| *H01J 37/32* | (2006.01) |

(52) U.S. Cl.
CPC ........ *C23C 16/4412* (2013.01); *C23C 16/308* (2013.01); *C23C 16/5096* (2013.01); *H01J 37/3244* (2013.01); *H01J 37/32091* (2013.01)

(58) Field of Classification Search
USPC ............... 118/715–733; 156/345.33, 345.34
See application file for complete search history.

(56) References Cited

U.S. PATENT DOCUMENTS

| | | | |
|---|---|---|---|
| 4,590,042 A * | 5/1986 | Drage | H01J 37/3244 156/345.34 |
| 5,552,017 A | 9/1996 | Jang et al. | |
| 5,624,498 A | 4/1997 | Lee et al. | |
| 6,149,729 A | 11/2000 | Iwata et al. | |
| 8,074,599 B2 | 12/2011 | Choi et al. | |
| 2003/0032301 A1 | 2/2003 | Dhindsa et al. | |
| 2005/0118737 A1 | 6/2005 | Takagi et al. | |
| 2005/0208217 A1* | 9/2005 | Shinriki | C23C 16/34 427/248.1 |
| 2006/0234514 A1* | 10/2006 | Gianoulakis | C23C 16/4412 438/758 |
| 2007/0068625 A1* | 3/2007 | Funk | C23C 16/4412 156/345.29 |
| 2007/0163716 A1 | 7/2007 | Hsiao et al. | |
| 2007/0209588 A1* | 9/2007 | Li | C23C 16/4412 118/715 |
| 2009/0305509 A1 | 12/2009 | Stevenson et al. | |
| 2011/0186228 A1 | 8/2011 | Huang et al. | |

(Continued)

OTHER PUBLICATIONS

"In situ wafer temperature measurement during plasma etching", Electro IQ, Technology Insights for Electronics Manufacturing, found at http://www.electroiq.com/content/eiq-2/en/articles/sst/print/volume-42/issue-10/features/metrology-test/in-situ-wafer-temperature-measurement-during-plasma-etching.html.

*Primary Examiner* — Rakesh Dhingra
(74) *Attorney, Agent, or Firm* — Duane Morris LLP

(57) ABSTRACT

An apparatus comprises: a shower head having a supply plenum for supplying the gas to the chamber and a vacuum manifold fluidly coupled to the supply plenum; and at least one vacuum system fluidly coupled to the vacuum manifold of the shower head.

17 Claims, 6 Drawing Sheets

(56) References Cited

U.S. PATENT DOCUMENTS

2011/0214814 A1* 9/2011 Iizuka .................. C23F 1/08
　　　　　　　　　　　　　　　　　　　　156/345.34
2012/0145078 A1* 6/2012 Huang ............. C23C 16/45565
　　　　　　　　　　　　　　　　　　　　118/715

* cited by examiner

SHOWER HEAD APPARATUS AND METHOD FOR CONTROLLING PLASMA OR GAS DISTRIBUTION

FIELD

The disclosed apparatus and method relate to semiconductor processing. More particularly, the disclosed subject matters relate to a shower head for use in a semiconductor processing chamber in the process of chemical vapor deposition (CVD) or plasma etching.

BACKGROUND

Chemical vapor deposition (CVD) of films and plasma dry etching are extensively used in the semiconductor industry for fabricating integrated circuits on semiconductor wafers. Plasma enhanced CVD is one of the CVD methods used for thin film formation.

The deposition and etching processes are generally performed in a single-wafer reactive chamber. Inside the chamber, a reactant processing gas for film formation or etching is introduced through a shower head over the wafer. The reactant processing gas may or may not be transformed into plasma before striking the semiconductor wafer.

Non-uniformity of a chemical vapor deposited film or the etching in the desired areas can damage device structures and reduce the chip yield in the semiconductor fabrication. For example, deposition of a thin film at an Angstroms or nanometer level of thickness should be precisely controlled. Localized over-etching of the underlying layer should also be avoided.

Meanwhile, the size of semiconductor wafers has gradually increased to improve throughput and reduce cost per die. For example, in the transition from 300 mm to 450 mm wafer size, the wafer area increases by 125%. The within wafer uniformity (WiWU) becomes more difficult to maintain in the more-than-double-sized wafer.

BRIEF DESCRIPTION OF THE DRAWINGS

The present disclosure is best understood from the following detailed description when read in conjunction with the accompanying drawings. It is emphasized that, according to common practice, the various features of the drawings are not necessarily to scale. On the contrary, the dimensions of the various features are arbitrarily expanded or reduced for clarity. Like numerals denote like features throughout specification and drawing.

DETAILED DESCRIPTION

Figure 1:
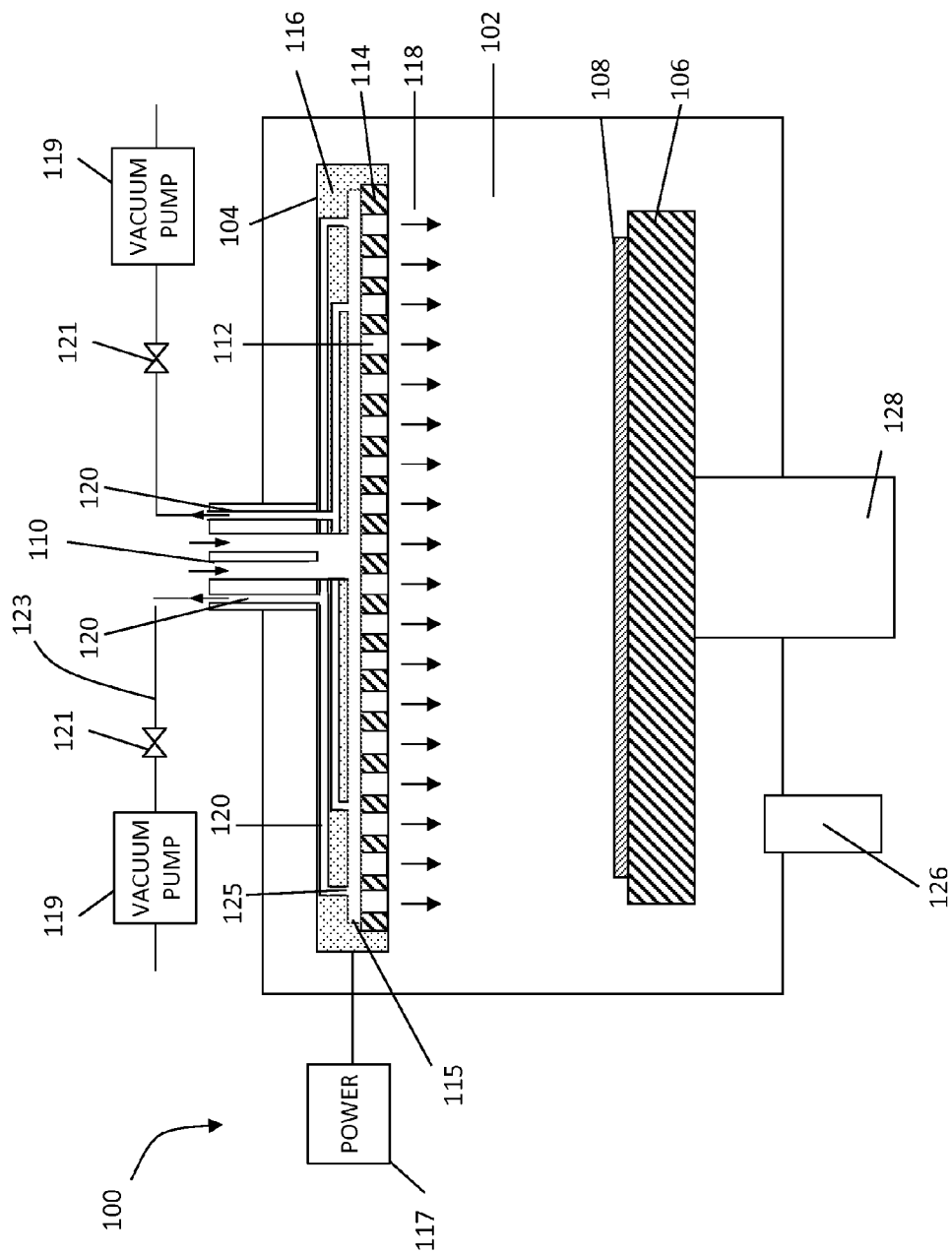
FIG. 1 is schematic cross-section view illustrating an exemplary semiconductor equipment system having a shower head apparatus comprising at least one vacuum system, in accordance with some embodiments.

This description of the exemplary embodiments is intended to be read in connection with the accompanying drawings, which are to be considered part of the entire written description. In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

The disclosure provides an apparatus comprising a shower head and at least one vacuum system fluidly coupled to the shower head, a related semiconductor equipment system, and a method comprising applying vacuum in at least zone of the shower head. The apparatus, the semiconductor equipment system and the related method are provided to increase uniformity of plasma or processing gas emitted from the shower head, and ultimately the uniformity of films deposited in a chemical vapor deposition (CVD), plasma etching and other semiconductor processes.

In some embodiments, an apparatus comprises: a shower head having a supply plenum for supplying the gas to the chamber and a vacuum manifold fluidly coupled to the supply plenum; and at least one vacuum system fluidly coupled to the vacuum manifold of the shower head. The shower head is configured to be mounted inside a chamber and provide a processing gas onto a semiconductor wafer inside the chamber. The vacuum manifold and the at least one vacuum system are configured to provide vacuum in at least one zone of the shower head. The apparatus having couplings to vacuum provides uniform distribution of processing gas, which may or may not comprise plasma, toward the semiconductor substrate inside the chamber to achieve uniform film thickness in a deposition or etching process.

For brevity and clarification, references to "back vacuum" made below will be understood to encompass the vacuum applied to a portion of a manifold, chamber or space inside a shower head inside a semiconductor processing chamber, unless expressly indicated otherwise. References to "back vacuum" made below will be understood to distinguish from the vacuum outside of the showerhead, which is generally applied to the semiconductor processing chamber.

FIG. 1 is schematic cross-section view illustrating an exemplary semiconductor equipment system 100 having a shower head apparatus comprising at least one vacuum system, in accordance with some embodiments.

In FIG. 1, the exemplary semiconductor equipment system 100 comprises a chamber 102, a shower head 104 and a stage 106 for a semiconductor substrate 108. Shower head 104 and stage 106 are configured to be mounted inside chamber 102. Semiconductor substrate 108 is disposed on stage 106. In the example, shower head 104 is disposed over stage 106. In other embodiments, the chamber is oriented horizontally (i.e., rotated 90 degrees from the position in FIG. 1).

Shower head 104 is a gas distribution apparatus. Shower head 104 is configured to provide a processing gas onto a semiconductor wafer 108 inside a chamber 102.

Shower head 104 comprises a first plate 114, a second plate 116, and an inlet 110 for feeding a reactant gas. Shower head 104 also comprises a supply plenum 115 for supplying a gas comprising at least one chemical to chamber 102, and a vacuum manifold 120, which is fluidly coupled to supply plenum 115.

The first plate 114 of shower head 104 has a plurality of openings 112 that are adapted for providing the processing gas 118 flowing from shower head 104 to the semiconductor wafer 108 inside the chamber 102. In some embodiments, the first plate 114 is in a circular shape.

The second plate 116 of shower head 104 is coupled to the first plate 114. In some embodiment, the second plate 116 provides the side of the supply plenum 115 opposite the first plate 114, where plate 114 has the plurality of openings 112. The bottom of plate 114 faces the semiconductor wafer 108. In some embodiments, the second plate 116 has a circular shape. In some embodiments, the second plate 116 houses a vacuum manifold 120 of shower head 104.

The supply plenum 115 is the space between the first plate 114 and second plate 116. The first plate 114 defines a first side of supply plenum 115. The second plate 116 defines a second side of supply plenum 115.

In some embodiments, the first plate 114 and the second plate 116 are configured so that a space exists between the first and the second plates for the at least one chemical in the gas state to flow from inlet 110 to the plurality of openings on the first plate 114. In some embodiments, the space between the first plate 114 and second plate 116 forms the entirety of the supply plenum 115.

An inlet 110 is connected with the supply plenum 115 and adapted to supply at least one chemical in a gas state from outside chamber 102. In some embodiments, two or more chemicals in a gas state are supplied through inlet 110.

At least one vacuum system 119 is fluidly coupled to vacuum manifold 120 of shower head 104. Vacuum manifold 120 and the at least one vacuum system are configured to provide vacuum in at least one zone of shower head 104.

In some embodiments, a vacuum system comprises a vacuum pump 119, a valve 121 or other suitable control device, which is in between the vacuum pump 119 and the vacuum manifold 120.

In some embodiments, each of the at least one vacuum system comprises a conduit 123 for vacuum. The conduit 123 for vacuum is connected to at least one opening 125 in the second plate 116 and is connected and configured to provide vacuum in a respective area in the space between the first and second plates.

In some embodiments, the conduit 123 for vacuum comprises an external vacuum line, an internal vacuum line on the second plate 116, a tunnel inside the second plate 116 or a combination thereof. The conduit for vacuum is connected to supply plenum 115 or the space between the first plate 114 and the second plate 116 through the least one openings 125 in the second plate 116.

The number of vacuum systems can be more than one in some embodiments. The Two vacuum systems are shown in FIG. 1 for illustration purpose. In some embodiments, vacuum manifolds 120 are adapted to be connected with at least two vacuum systems. The resulting apparatus comprises at least two vacuum systems. Shower head 104 is capable of being vacuumed in at least two vacuum zones. The vacuum systems provide back vacuum on shower head 104. For example, in FIG. 1, the gas enters the center of the supply plenum 115. Without any back vacuum, the flow of gas can be greater in the center of the showerhead. By applying the back vacuum to the outer portion of the supply plenum 115, the distribution of the gas is made more even.

Figure 2:
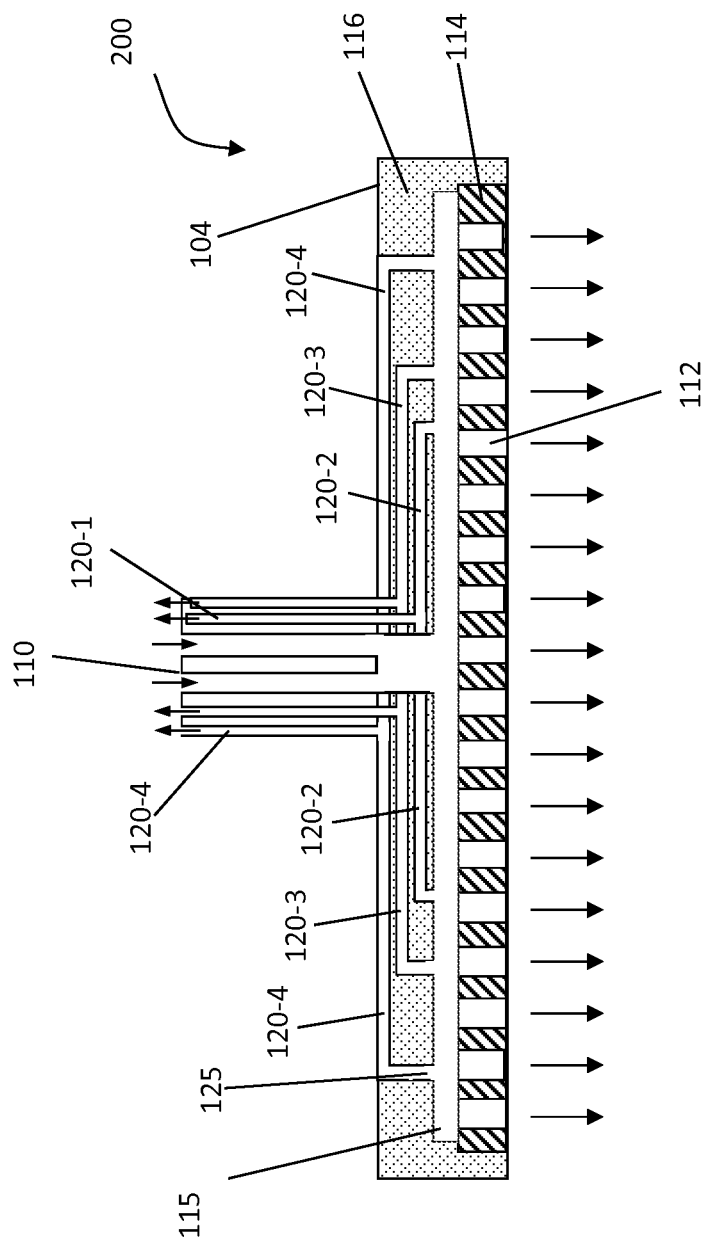
FIG. 2 is a section-section view of an exemplary shower head comprising a vacuum manifold for providing four vacuum zones, in accordance with some embodiments.

In some embodiments, for example, the apparatus comprises four vacuum systems. Vacuum manifold 120 is configured to provide four vacuum zones through the openings 125 in the second plate 116. An example of an apparatus having four vacuum zones is shown in FIG. 2.

In some embodiments, the vacuum systems are connected to a processor (not shown), which automatically adjusts the vacuum level in each zone of shower head 104. The processor can be, for example, a central processing unit (CPU), a microprocessor, a programmable logic control unit, a computer or other device or system that is adapted to control respective vacuum level in respective vacuum zones.

The at least one opening 125 in the second plate 116 can be a single opening. In some embodiments, the at least one opening 125 in the second plate 116 comprises a plurality of orifices in the second plate. The plurality of orifices in one vacuum zone may be arranged in a shape. For example, in some embodiments, the plurality of orifices of the openings 125 in one vacuum zone are arranged in a circular shape. This circular shape is oriented concentrically with semiconductor substrate 108 (also of circular shape) along the same axis. However, the shape, size, spacing and arrangement of the orifices are not limited to a certain configuration.

Processing gas 118 can be, for example, a pure chemical gas, a mixed chemical gas, a mist or moisture of chemical, an ionized gas comprising plasma, a mixture of gas comprising liquid drops, or any other type of chemicals suitable for a semiconductor process for deposition or etching.

In some embodiments, processing gas 118 is the same as the at least chemical in a gas state fed through inlet 110, without significant changes in chemical composition and physical state. In some embodiments, the apparatus 100 is a single wafer furnace apparatus. For such embodiments, the power supply 117 can be eliminated.

In some embodiments, processing gas 118 is a plasma comprising ionized chemical species from the at least one chemical in gas state fed through inlet 110. If a plasma method is used, shower head 104 also serves as an electrode which is connected with a radio frequency (RF) power, for example. The reactant gas is ionized to form a plasma containing processing gas. Power 117 provides energy for the ionization process.

Power 117 can be, for example, a radio frequency (RF) power supply or other power supply that is adapted to provide a high voltage sufficient to ionize the at least one chemical in a gas state fed through inlet 110, and to generate plasma in chamber 102.

Chamber 102 is for deposition or etching in semiconductor processing. In some embodiment, it is an etch apparatus. In some other embodiments, it is a CVD, a plasma enhanced CVD (PECVD), physical vapor deposition (PVD) or atomic layer deposition (ALD) chamber, or any other semiconductor processing chamber. Examples of related applications include but are not limited to formation of films of shallow trench isolation (STI), advanced patterned film/antireflective coating (APF/ARC) oxide, and low dielectric constant materials.

Semiconductor substrate or wafer 108 can be, for example, a silicon substrate, a III-V semiconductor compound, a glass substrate, a liquid crystal display (LCD)

substrate, or any other suitable substrate. In some embodiments, semiconductor substrate 108 is a blank substrate or comprises a variety of integrated devices or circuits, or layers of forming such devices or circuits.

The film deposited on semiconductor substrate 108 can be any suitable thin film. Examples of films deposited on semiconductor substrate 108 include but are not limited to amorphous silicon (α-Si), polycrystalline silicon, silicon nitride as gate dielectric, silicone dioxide and a metallic layer.

A vacuum port 126 is on chamber 102 in some embodiments. Connected with a vacuum pump with controls, vacuum port 126 is used to apply vacuum for the whole chamber 102. The vacuum applied to chamber 102 (between the walls of chamber 102 and the outer surface of shower head 104) is distinguished from the back vacuum applied to shower head 104 in this disclosure.

Stage 106 is disposed within chamber 102 with a stage support 128. In some embodiments, stage 106 is disposed on the chamber 102 so that a portion of stage 106 is outside chamber 102. Stage support 128 may not be needed in such embodiments.

Stage 106 may comprise an electro-static chuck, vacuum system, clamp or other apparatus that is able to keep semiconductor substrate 108 substantially on stage. In some embodiments, stage 106 further comprises a bottom electrode coupled to a power supply to enhance plasma within chamber 102.

In some embodiments, stage 106 comprises a heater (not shown) for heating the semiconductor substrate. The semiconductor substrate or wafer can be also heated by radiant heating through a quartz window (not shown) at the bottom of chamber 102.

In some embodiments, the materials suitable for the chamber and the shower head are anodized aluminum, aluminum alloy, ceramic, and other corrosion resistant materials.

The apparatus having back vacuum to shower head 104 provides uniform distribution of processing gas toward the semiconductor substrate inside the chamber to achieve uniform film thickness in a deposition or etching process.

FIG. 2 is a section-section view of an exemplary shower head 200 comprising a vacuum manifold for providing four vacuum zones, in accordance with some embodiments.

In FIG. 2, like items are indicated by like reference numerals, and for brevity, descriptions of the structure, provided above with reference to FIG. 1, are not repeated.

The exemplary vacuum manifold for providing four vacuum zones is illustrated in FIG. 2. The four portions of vacuum manifold are labeled as 120-1, 120-2, 120-3 and 120-4, respectively. Each portion or vacuum zone in the second plate 116 is connected with a vacuum system as described in FIG. 1. Each opening 125 on the second plate 116 can optionally face directly toward one of the plurality of the opening 112 on the first plate 114. The size and shape of each opening 125 vary in different embodiments.

In some embodiments, both the first plate 114 and the second plate 116 are in a circular shape.

In some embodiments, the opening 125 on the manifold 120 for vacuum conduit 123 for each vacuum zone (120-1, 2, 3, and 4) is in a circular shape. This circular shape is oriented concentrically with the semiconductor substrate 108 of circular shape along a common axis. In some embodiments, the opening 125 comprises a plurality of orifices 127 arranged in a circular pattern as described below in FIG. 3.

Figure 3:
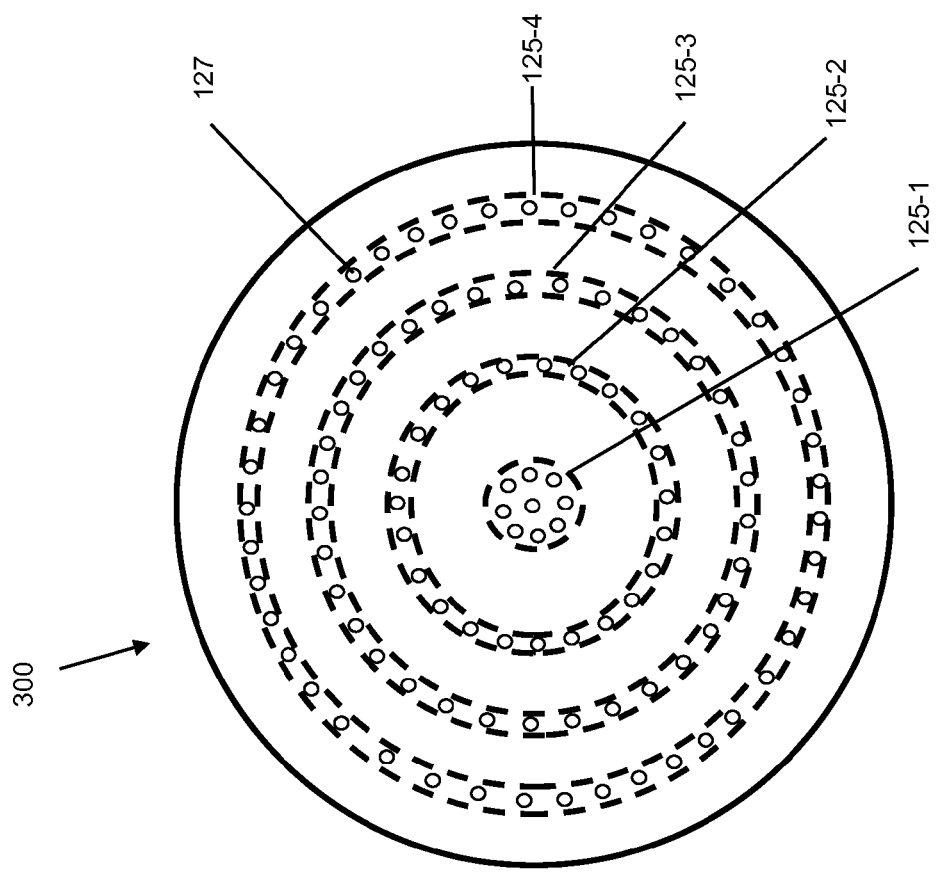
FIG. 3 is a plan view illustrating the openings of the manifold in the second plate which are fluidly coupled with vacuum conduit according to the four vacuum zones in an exemplary shower head of FIG. 2.

FIG. 3 is a plan view 300 illustrating the openings 125 of the manifold 120 in the second plate 116 which are fluidly coupled with vacuum conduit 123 according to the four vacuum zones in an exemplary shower head of FIG. 2.

In FIG. 3, each of the openings 125 for one vacuum zone in the second plate 116 comprises a plurality of orifices 127 that are arranged in a circular shape. The areas for the openings having plurality of orifices for each vacuum zone are illustrated in dotted lines and are labeled as 125-1, 2, 3 and 4 in FIG. 3, corresponding to the vacuum zones in the manifold 120 labeled as 120-1, 2, 3 and 4 in FIG. 2, respectively. The plurality of orifices 127 are within on the areas 125-1, 2, 3, and 4. The size, shape, spacing and arrangement of the orifices are not limited to a certain configuration.

Figure 4:
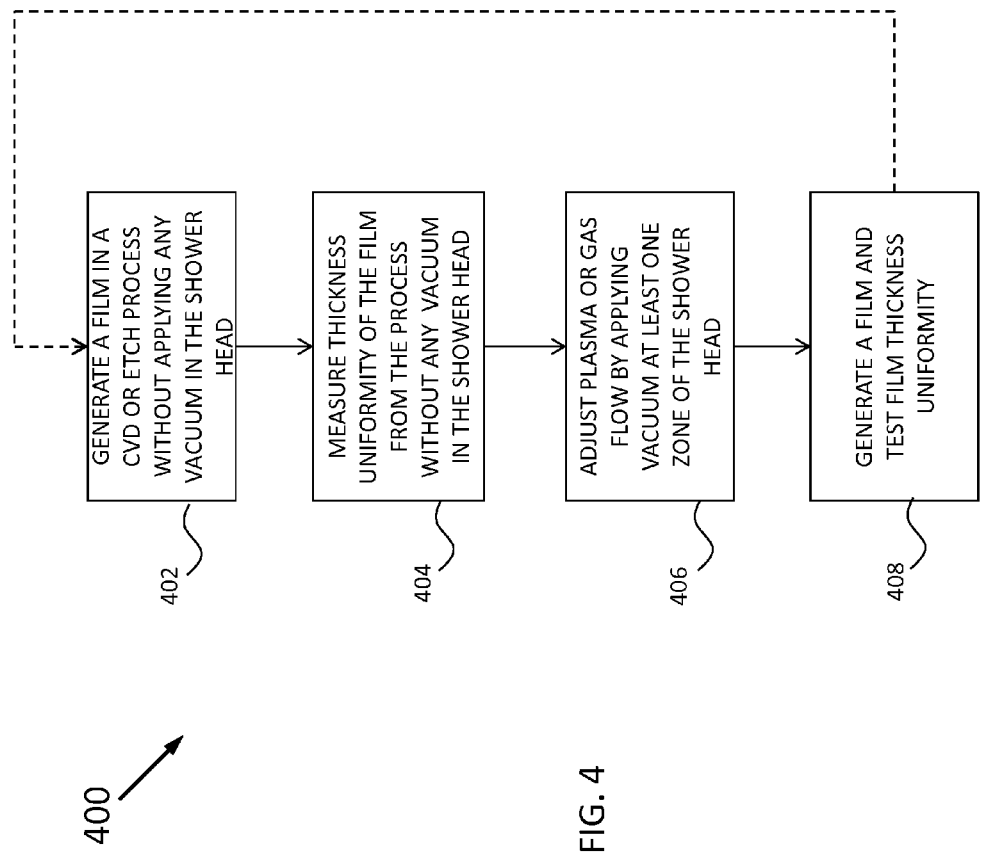
FIG. 4 is a flow chart diagram illustrating an exemplary method comprising applying vacuum in at least one zone of a shower head in a semiconductor process, in accordance with some embodiments.

FIG. 4 is a flow chart diagram illustrating an exemplary method 400 comprising applying back vacuum in at least one zone of a shower head in a semiconductor process, in accordance with some embodiments.

In step 402, a control film is formed in a process such as CVD or etching process without applying any vacuum in the shower head in an exemplary semiconductor equipment system as shown in FIG. 1. In some embodiments, for example, this film is a silicon dioxide dielectric film or a silicon nitride film deposited on a semiconductor substrate such as a silicon wafer by a CVD process following a standard procedure.

In step 404, film thickness is measured to determine uniformity of the film thickness following standard procedures such as optical ellipsometry. Examples of suitable measurement tools for film thickness include, but are not limited to KLA-TENCOR Spectra FX100 ACCUFILM, available from KLA-TENCOR of Milpitas, Calif.

Figure 5:
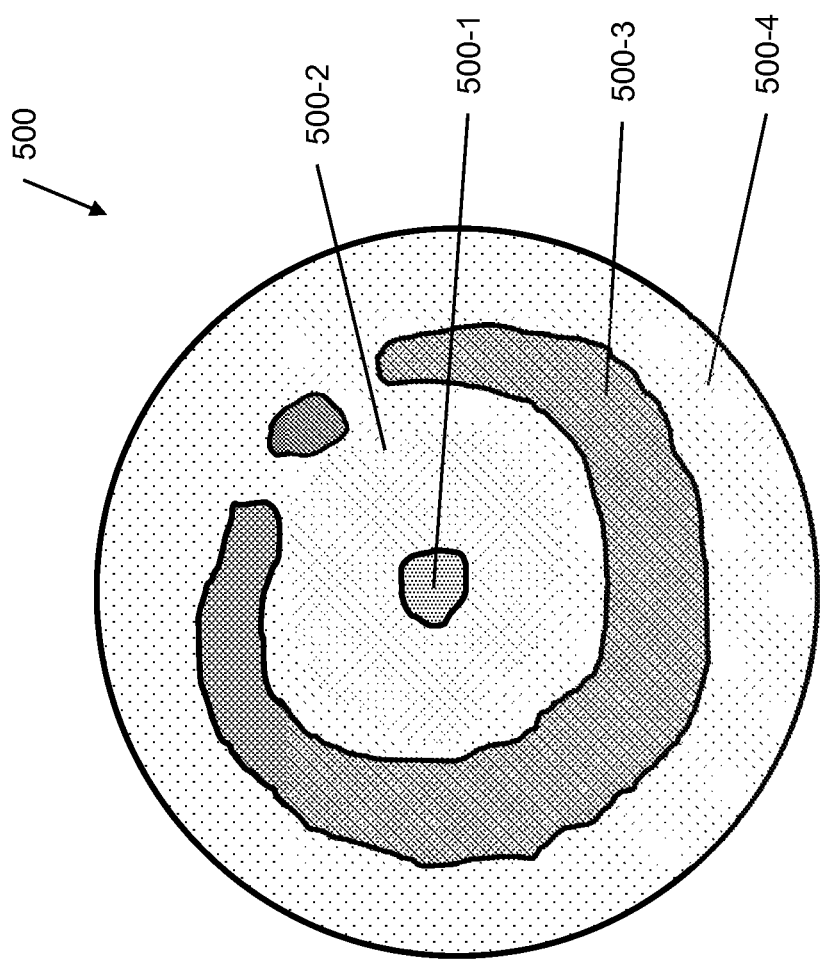
FIG. 5 is a schematic diagram illustrating a film deposited in a CVD process without applying any vacuum to a shower head.

For example, FIG. 5 is a schematic diagram illustrating a film 500 deposited in a CVD process without applying any vacuum to a shower head.

In the process of obtaining the film of FIG. 5, a mixture of $SiH_4$, $N_2O$ and helium was used. The flowing rate was approximately 10000 sccm (stand square centimeter per minutes). RF power range from 10-400 W was needed to generate plasma. The resulting film was oxynitride (SiON) above the substrate, which was a silicon blanket wafer.

In FIG. 5, the thickness of the exemplary deposited film is not uniform. The areas labeled as 500-1 and 500-3 have significantly higher thickness than the areas labeled as 500-2 and 500-4. The areas labeled as 500-2 and 500-4 have identical or similar film thickness to each other. The area labeled as 500-3 has higher film thickness than the area labeled as 500-1 does. For example, the average thickness in are 500-3 is about 186 Angstroms while the average film thickness across the whole wafer is 175 Angstroms.

In step 406 of FIG. 4, plasma or gas flow on the shower head is adjusted based on the results obtained in step 404. In some embodiments, vacuum is applied to at least zone of the exemplary shower head described in FIG. 1 and FIG. 2. The vacuum level for each zone is adjusted by controlling the valve 121 and the vacuum pump 119 as described in FIG. 1. In some embodiments, the vacuum systems are connected to a processor (not shown), which automatically adjusts the vacuum level in each zone of the shower head. The processor can be, for example, a central processing unit (CPU), a microprocessor, a programmable logic control unit, a computer or other device or system that is adapted to control respective vacuum level in respective vacuum zones.

At step 408, a film is generated and the thickness of the film is tested for uniformity. For example, FIG. 6 a schematic diagram illustrating a film 600 deposited in a CVD process with applying vacuum to the shower head, in accordance with some embodiments. The exemplary film in FIG. 6 is compared to that in FIG. 5.

Figure 6:
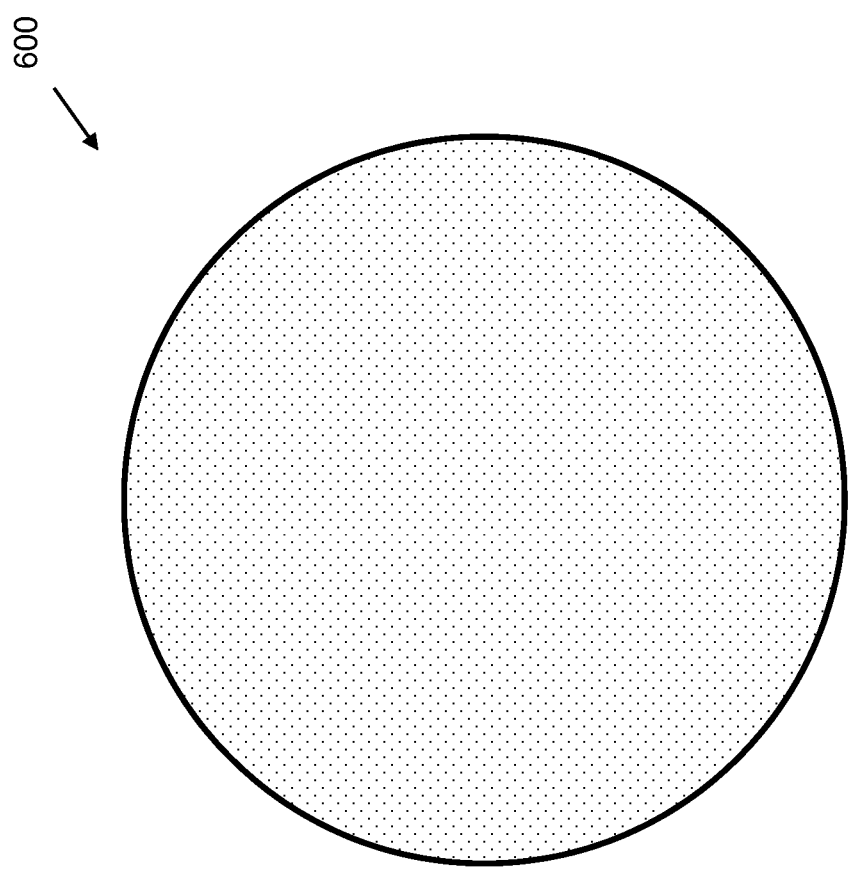
FIG. 6 a schematic diagram illustrating a film deposited in a CVD process with applying vacuum to the shower head, in accordance with some embodiments.

Vacuum was applied to the shower head of FIG. 2 to increase film uniformity of the deposited film shown in FIG. 5 and obtain the film as shown in FIG. 6. The other conditions were the same as those in the process for the film of FIG. 5. In the shower head of FIG. 2, no vacuum was applied to the portion or vacuum zone 120-4. Vacuum was applied in order of increasing magnitude of vacuum in vacuum zones 120-2, 120-1 and 120-3, respectively. For example, the highest vacuum level used in the vacuum zone 120-3 turned about 6% of the gas stream back away from this zone of the showerhead.

The resulting deposited film 600 has uniform distribution of film thickness as shown in FIG. 6.

The disclosure provides an apparatus comprising a shower head and at least one vacuum system fluidly coupled to the shower head, a related semiconductor equipment system, and a method comprising applying vacuum in at least zone of the shower head.

In some embodiments, an apparatus comprises a shower head having a supply plenum for supplying the gas to the chamber and a vacuum manifold fluidly coupled to the supply plenum; and at least one vacuum system fluidly coupled to the vacuum manifold of the shower head. The shower head is configured to be mounted inside a chamber and provide a processing gas onto a semiconductor wafer inside the chamber. The vacuum manifold and the at least one vacuum system are configured to provide vacuum in at least one zone of the shower head.

In some embodiments, the shower head comprises a first plate, an inlet and a second plate. The first plate defines a first side of the supply plenum, and have a plurality of openings adapted for providing the processing gas flowing from the shower head to the semiconductor wafer inside the chamber. The inlet is connected with the supply plenum, and is adapted to supply at least one chemical in a gas state from outside the chamber. The second plate defines a second side of the supply plenum.

In some embodiments, the first plate and the second plate are configured so that a space exists between the first and the second plates for the at least one chemical in the gas state to flow from the inlet to the plurality of openings on the first plate.

In some embodiments, each of the at least one vacuum system comprises a conduit for vacuum. The conduit for vacuum is connected to at least one opening in the second plate and is configured to provide vacuum in a respective area in the space between the first and second plates.

In some embodiments, the apparatus comprises at least two vacuum systems. In some embodiments, the apparatus four vacuum systems connected to a shower head.

In some embodiments, a semiconductor equipment system comprises a processing chamber; and an apparatus for providing a processing gas onto a semiconductor wafer inside the processing chamber. The apparatus comprises a shower head and at least one vacuum system fluidly coupled to the shower head. The shower head is configured to be mounted inside the processing chamber, and have a supply plenum for supplying the gas to the chamber and a vacuum manifold fluidly coupled to the supply plenum. The at least one vacuum system is fluidly coupled to the vacuum manifold of the shower head.

In some embodiments, a method of semiconductor processing comprises feeding at least one chemical in a gas state into a processing chamber through a shower head having a supply plenum; and applying vacuum to at least one portion of the supply plenum of the shower head. Vacuum to the at least one portion of the supply plenum of the shower head is applied through at least one portion or vacuum zone of a vacuum manifold in the shower head.

Although the subject matter has been described in terms of exemplary embodiments, it is not limited thereto. Rather, the appended claims should be construed broadly, to include other variants and embodiments, which may be made by those skilled in the art.

What is claimed is:

1. An apparatus, comprising:
   a stage configured to support a semiconductor wafer;
   a shower head configured to be mounted inside a chamber and provide a processing gas onto the semiconductor wafer inside the chamber, the shower head having a supply plenum for supplying the gas to the chamber and a vacuum manifold fluidly coupled to the supply plenum, wherein the vacuum manifold comprises a plurality of vacuum zones, wherein each of the plurality of vacuum zones has a respective plurality of openings;
   a first vacuum system fluidly coupled to the respective plurality of openings of a first subset of the plurality of vacuum zones of the vacuum manifold of the shower head, wherein the first vacuum system is configured to selectively apply a first vacuum level to the first subset of the plurality of vacuum zones; and
   a second vacuum system fluidly coupled to the respective plurality of openings of a second subset of the plurality of vacuum zones of the vacuum manifold of the shower head, wherein the second vacuum system configured to selectively apply a second vacuum level to the second subset of the plurality of vacuum zones; and
   a controller connected to the first and the second vacuum systems and configured to receive a thickness measurement of a film deposited on the semiconductor wafer for at least a first area of the semiconductor wafer and a second area of the semiconductor wafer after supplying the processing gas, with the first vacuum system at the first vacuum level and the second vacuum system at the second vacuum level, wherein the controller is configured to adjust at least one of the first vacuum level of the first vacuum system and the second vacuum level of the second vacuum system in response to the film thickness measurement, to increase uniformity of the deposited film.

2. The apparatus of claim 1, wherein the shower head comprises:
   a first plate defining a first side of the supply plenum, the first plate having a plurality of openings adapted for providing the processing gas flowing from the shower head to the semiconductor wafer inside the chamber;
   an inlet connected with the supply plenum and adapted to supply at least one chemical in a gas state from outside the chamber; and
   a second plate defining a second side of the supply plenum.

3. The apparatus of claim 2, wherein the first plate and the second plate are configured so that a space exists between the first and the second plates for the at least one chemical in the gas state to flow from the inlet to the plurality of openings on the first plate.

4. The apparatus of claim 3, wherein each of the first and second vacuum systems comprises a conduit for vacuum, and the conduit for vacuum is connected to at least one of the respective plurality of openings associated with each of the plurality of vacuum zones, wherein the respective plurality of openings are formed in the second plate, and wherein the plurality of vacuum zones are located in the space between the first and second plates.

5. The apparatus of claim 4, wherein the conduit for vacuum is a vacuum line or a tunnel inside the second plate and is connected to the space between the first and second plate through the respective plurality of openings on the second plate.

6. The apparatus of claim 4, comprising four vacuum systems.

7. The apparatus of claim 4, wherein the each respective plurality of openings is arranged in a respective circular pattern.

8. The apparatus of claim 4, wherein the respective plurality of openings in the second plate for the conduit for vacuum and the plurality of openings on the first plate for providing the processing gas are on opposite sides of the supply plenum.

9. The apparatus of claim 3, wherein each of the first and second vacuum systems further comprises a respective vacuum pump.

10. A semiconductor equipment system, comprising:
a processing chamber including a stage configured to support a semiconductor wafer; and
an apparatus configured to provide a processing gas onto a semiconductor wafer inside the processing chamber, the apparatus comprising:
a shower head configured to be mounted inside the processing chamber, the shower head having a supply plenum for supplying the gas to the chamber and a vacuum manifold fluidly coupled to the supply plenum, wherein the vacuum manifold comprises a plurality of vacuum zones, wherein each of the plurality of vacuum zones has a respective plurality of openings; and
a first vacuum system fluidly coupled to the respective plurality of openings of a first subset of the plurality of vacuum zones of the vacuum manifold of the shower head, and; and
a second vacuum system fluidly coupled to the respective plurality of openings of a second subset of the plurality of vacuum zones of the vacuum manifold of the shower head; and
a controller connected to the first and the second vacuum systems and configured to receive a thickness measurement of a film deposited for at least a first area of the semiconductor wafer and a second area of the semiconductor wafer after supplying the processing gas, wherein the controller is configured to adjust at least one of the first vacuum system and the second vacuum system in response to the film thickness measurement, to increase uniformity of the deposited film.

11. The semiconductor equipment system of claim 10, wherein the shower head comprises:
a first plate defining a first side of the supply plenum, the first plate having a plurality of first openings adapted for providing the processing gas flowing from the shower head to the semiconductor wafer inside the chamber;
an inlet connected with the supply plenum and adapted to supply at least one chemical in a gas state from outside the chamber; and
a second plate defining a second side of the supply plenum, the supply plenum configured so that a space exists between the first and the second plates for the at least one chemical in the gas state to flow from the inlet to the plurality of openings on the first plate.

12. The semiconductor equipment system of claim 11, wherein each of the first and second vacuum systems comprises a conduit for vacuum inside the second plate, wherein a plurality of second openings are formed in the second plate and the conduit for vacuum is connected to at least one of the plurality of second openings and wherein the plurality of vacuum zones are located in the space between the first and second plates.

13. The semiconductor equipment system of claim 12, wherein each plurality of second openings is arranged in a respective circular pattern.

14. The semiconductor equipment system of claim 11, comprising a third vacuum system and a fourth vacuum system fluidly coupled to the shower head.

15. The semiconductor equipment system of claim 10, further comprising at least one exhaust port on a wall of the processing chamber, wherein the exhaust port fluidly couples the processing chamber to vacuum.

16. The semiconductor equipment system of claim 10, further comprising a power source which is configured to ionize the at least one chemical in the gas state to form a processing gas comprising plasma.

17. A semiconductor equipment system, comprising:
a processing chamber including a stage configured to support a semiconductor wafer; and
an apparatus configured to provide a processing gas onto a semiconductor wafer inside the processing chamber, the apparatus comprising:
a shower head configured to be mounted inside the processing chamber, the shower head having a supply plenum for supplying the gas to the chamber and a vacuum manifold fluidly coupled to the supply plenum, wherein the supply plenum comprises a first plate and a second plate in an opposed relationship, wherein the vacuum manifold comprises a plurality of vacuum zones, and wherein each of the plurality of vacuum zones has a respective plurality of openings formed in the second plate; and
a first vacuum system fluidly coupled to the respective plurality of openings of a first subset of the plurality of vacuum zones of the vacuum manifold of the shower head, and wherein the respective plurality of openings of the first subset of the plurality of vacuum zones are arranged in a circular shape oriented concentrically with the stage inside the chamber; and
a second vacuum system fluidly coupled to the respective plurality of openings of a second subset of the plurality of vacuum zones of the vacuum manifold of the shower head, and wherein the respective plurality of openings of the second subset of the plurality of vacuum zones are arranged in a circular shape oriented concentrically with the stage inside the chamber and concentrically with the respective plurality of openings of the first subset of the plurality of vacuum zones; and
a controller connected to the first and the second vacuum systems and configured to receive a thickness measurement of a film deposited for at least a first area of the semiconductor wafer and a second area of the semiconductor wafer after supplying the processing gas, with the first vacuum system at a first vacuum level and the second vacuum system at a second vacuum level, wherein the controller is configured to adjust at least one of the first vacuum level of the first vacuum system and the second vacuum level of the second vacuum system in response to the film thickness measurement.

* * * * *